United States Patent
Birkeland et al.

(10) Patent No.: US 9,231,538 B1
(45) Date of Patent: Jan. 5, 2016

(54) ENERGY EFFICIENT, LOW DISTORTION AMPLIFICATION APPARATUS

(71) Applicant: MAXIM Intergrated Products, Inc., San Jose, CA (US)

(72) Inventors: Joel D. Birkeland, North Plains, OR (US); Matthew G. Waight, Pipersville, PA (US); Charles J. Razzell, Pleasanton, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 53 days.

(21) Appl. No.: 14/141,198

(22) Filed: Dec. 26, 2013

Related U.S. Application Data

(60) Provisional application No. 61/868,526, filed on Aug. 21, 2013.

(51) Int. Cl.
  *H03G 3/20* (2006.01)
  *H03F 3/45* (2006.01)

(52) U.S. Cl.
  CPC ................... *H03F 3/45071* (2013.01)

(58) Field of Classification Search
  CPC ........................................................ H03G 3/20
  USPC .................................. 330/136, 129, 285, 296
  See application file for complete search history.

(56) References Cited

U.S. PATENT DOCUMENTS

| | | | |
|---|---|---|---|
| 6,307,429 B1* | 10/2001 | Olgaard | 330/2 |
| 7,583,210 B2* | 9/2009 | Minobe | 341/118 |
| 8,970,298 B2* | 3/2015 | Zhu | 330/136 |
| 2009/0174477 A1* | 7/2009 | Lee et al. | 330/195 |
| 2014/0347124 A1* | 11/2014 | Joshi et al. | 330/51 |

\* cited by examiner

*Primary Examiner* — Henry Choe
(74) *Attorney, Agent, or Firm* — TIPS Group

(57) ABSTRACT

An energy efficient, low distortion amplification apparatus includes: a differential amplifier having a pair of differential inputs, a pair of outputs, and a bias current control input; a digital delay having an n-bit word input and an m-bit word output; a digital-to-analog converter (DAC) having an input coupled to the output of the digital delay and a pair of differential outputs coupled to the pair of differential inputs of the differential amplifier; and a bias current controller having an input coupled to the digital delay and having an output coupled to the bias current control input of the differential amplifier.

8 Claims, 4 Drawing Sheets

ENERGY EFFICIENT, LOW DISTORTION AMPLIFICATION APPARATUS

CROSS REFERENCE TO RELATED APPLICATION(S)

This application claims the benefit of U.S. Provisional Patent Application Ser. No. 61/868,526, filed Aug. 21, 2013, which is incorporated herein by reference.

BACKGROUND

Data Over Cable Service Interface Specification (DOCSIS) is an international telecommunications standard that permits the addition of high-speed data transfer over an existing cable TV (CATV) system. It is employed by many cable television operators to provide Internet access over their existing hybrid fiber-coaxial (HFC) infrastructure.

DOCSIS was developed by Cable Television Laboratories, Inc. (a/k/a "CableLabs") and a number of contributing companies in the late 1990's. The first specification, version 1.0, was issued in March 1997. The latest specification, DOCSIS 3.0, was released in August 2006 and significantly increased transmission speeds, both upstream and downstream, while introducing support for Internet Protocol version 6 (IPv6).

The next specification, DOCSIS 3.1, is in development and is expected to be field tested sometime in 2014. The DOCSIS 3.1 standard uses orthogonal frequency-division multiplexing (OFDM) to achieve at least 10 Gbit/s downstream and 1 Gbit/s upstream transmission rates.

With each successive specification the upstream bandwidth has increased. This requires ever-greater power to be produced by the cable modems to drive the DOCSIS upstream amplifiers which must amplify multiple digitally modulated channels simultaneously while keeping spurious distortion products very low, typically more than 50 dB below the carrier level.

To achieve the low distortion levels, power-hungry Class A amplification is typically used for DOCSIS upstream amplifiers. This is because combining multiple digitally modulated carriers creates signals with high peak-to-average ratios. Since the peaks must be faithfully reproduced to minimize bit error rate ("BER"), the amplifier must be biased to accommodate the peaks, resulting in high power dissipation. This is not desirable from a number of perspectives including power consumption, heating of the cable box, and degrading the circuitry of the cable box over time.

These and other limitations of the prior art will become apparent to those of skill in the art upon a reading of the following descriptions and a study of the several figures of the drawing.

SUMMARY

In an embodiment, set forth by way of example and not limitation, an energy efficient, low distortion amplifier includes: a differential amplifier having a pair of differential inputs, a pair of outputs, and a bias current control input; a digital delay having an n-bit word input and an m-bit word output; a digital-to-analog converter (DAC) having an input coupled to the output of the digital delay and a pair of differential outputs coupled to the pair of differential inputs of the differential amplifier; and a bias current controller having an input coupled to the digital delay and having an output coupled to the bias current control input of the differential amplifier.

In a further example embodiment, a transformer having a primary coil is coupled to the pair of outputs of the differential amplifier. In another example embodiment, the primary coil has a center tap coupled to a voltage source. In a further example embodiment, the digital delay includes a First-In-First-Out (FIFO) buffer. In another example embodiment, the input of the bias current controller is coupled to the n-bit word input of the digital delay. In a further example embodiment, the output of the bias current controller is digital. In yet another example embodiment, the output of the bias current controller is related to the input of the bias current controller. In certain example embodiments, the output of the bias current controller is a single bit, while in other example embodiments the output of the bias current controller has multiple bits. In certain example embodiments, the output of the bias current controller is an analog signal.

In certain example embodiments, a variable current source is coupled to the bias current control input. In other example embodiments, the differential amplifier includes multiple amplifiers. In certain example embodiments, the multiple amplifiers are configured in sequential stages. In other example embodiments at least one of the multiple amplifiers is a variable amplifier. In further example embodiments, at least one of the multiple amplifiers is biased by the variable current source.

In an embodiment, set forth by way of example and not limitation, a method for controlling a differential amplifier includes: applying a digital input signal to a bias current controller; developing a bias current control signal from the digital input signal; applying the bias current control signal to a bias current control input of a differential amplifier; delaying the digital input signal; applying the delayed digital input signal to a digital-to-analog converter (DAC) to develop a differential analog output; and applying the differential analog output to a pair of differential inputs of the differential amplifier.

In a further example embodiment, the digital input signal is delayed with a First-In-First-Out (FIFO) buffer. In another example embodiment, the bias current control signal is digital. In certain example embodiments, the bias current control signal is a single bit and in other example embodiment the bias current control signal is multiple bits. In still further example embodiments, the bias current control signal is related to the digital input signal. In certain example embodiments, the bias current control signal is an analog signal.

An advantage of example embodiments as set forth herein is that an energy efficient, low distortion, differential amplifier is provided which is well suited for such applications as being a DOCSIS upstream amplifier.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
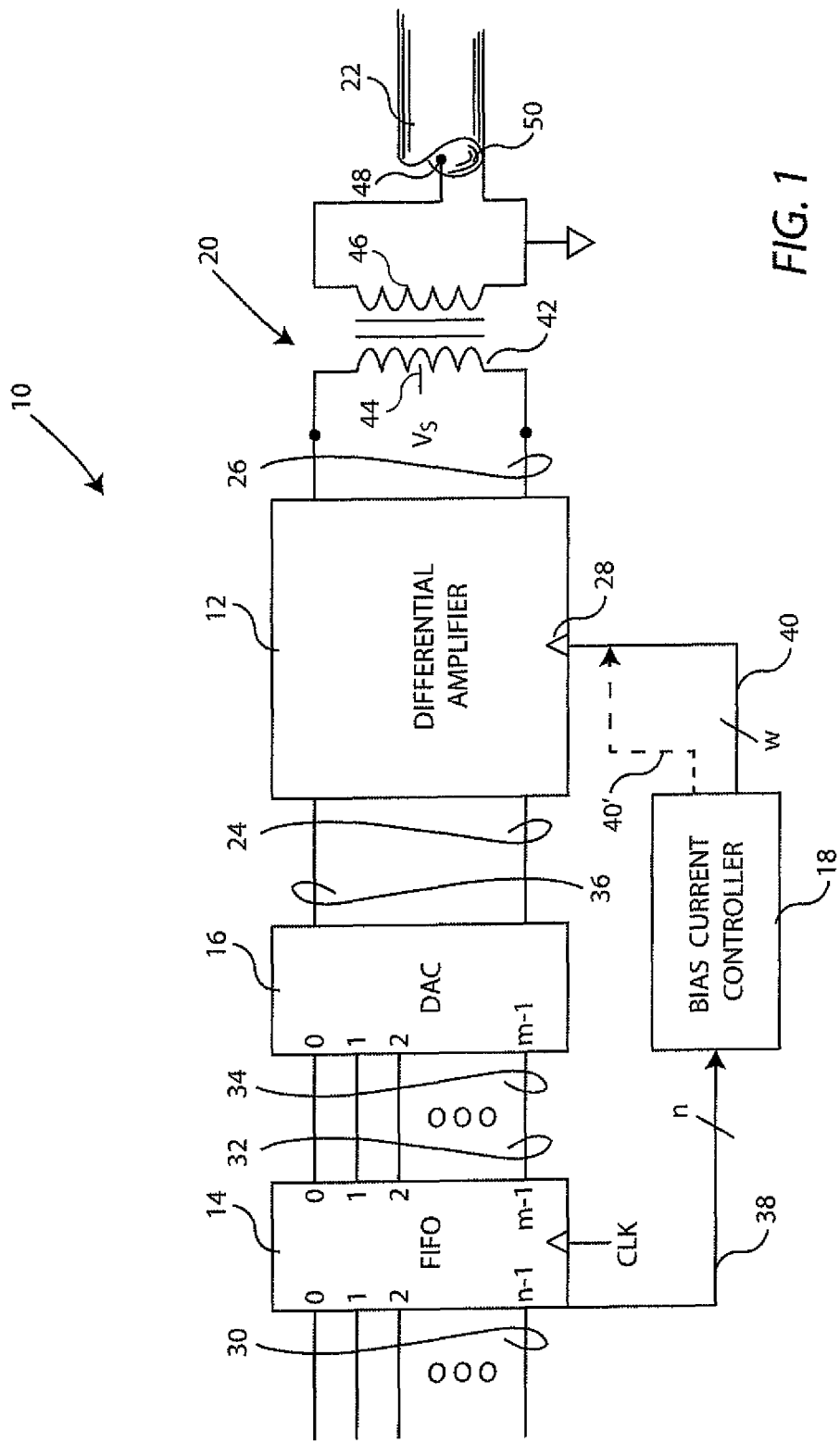
FIG. 1 is an example block diagram of an energy efficient, low distortion amplification apparatus 10 including a differential amplifier 12.

FIG. 1 is a block diagram, set forth by way of example and not limitation, of an energy-efficient, low distortion amplification apparatus 10 including a differential amplifier 12, a digital delay 14, a digital-to-analog converter (DAC) 16, and a bias current controller 18. Also illustrated are a transformer 20 and a coaxial cable 22.

Differential amplifier 12 is, in this non-limiting example, a "Class A" amplifier. Class A amplifiers are preferred in that they are low in distortion. In this non-limiting example, differential amplifier 12 has a pair of differential inputs 24, a pair of outputs 26, and a bias current control input 28. Differential amplifier 12 can be, by way of non-limiting example, a transconductance amplifier. As will be apparent to those skilled in the art, differential amplifier 12 can be other than a transconductance amplifier. Furthermore, as will be apparent to those of skill in the art, differential amplifier 12 can comprise, in whole or in part, one or more functionally equivalent pairs of single-ended amplifiers.

Digital delay 14 includes, in this non-limiting example, a First-In-First-Out ("FIFO") buffer having an n-bit word input and an m-bit word output. The depth of the FIFO buffer can be, for example, four words, and the length of the n-bit input word can be, for example, 16 bits (e.g. n=16). With such an example, a word applied to an n-bit word input 30 would take four clock cycles CLK to appear at an m-bit word output 32 of digital delay 14. In an embodiment, set forth by way of example and not limitation, n=m. In other example embodiments, n≠m (e.g. a digital delay can be provided that partially truncates the digital samples).

DAC 16 has an m-bit word input 34 coupled to the m-bit word output of the digital delay 14. The DAC converts the m-bit word at input 34 into a differential analog output on a pair of differential outputs 36 coupled to the pair of differential inputs of the differential amplifier 12.

Bias current controller (a/k/a "Digital Power Detector") 18 has an input 38 coupled to the digital delay 14 and an output 40 coupled to the bias current control input 28 of the differential amplifier 12. In this example embodiment, the input 38 is the n-bit word applied to the n-bit word input of the digital delay 14. Also in this example embodiment, the output 40 of the bias current controller 18 is digital, and has w bits. In certain examples w=1, and in other examples w>1. Generally, however, w≤n, e.g. the number of bits n input into the bias current controller 18 is greater than or equal to the number of bits w developed by the bias current controller 18. In other embodiments, an output 40' of the bias current controller 18 is an analog signal and the output 40 is not required.

Bias current controller 18 can take a variety of forms. By way of non-limiting example, bias current controller 18 can be a digital threshold detector. That is, when the digital signal at input 38 is greater than a predetermined value, a digital signal at output 40 can change from "0" to "1". By way of non-limiting example, a "0" signal on output 40 can signify that a 100 mA bias current is to be applied to the differential amplifier 12, while a "1" signal on output 30 can signify that the bias current is to be increased to 200 mA.

In a further non-limiting example, the output 40 has multiple bits, e.g. m≥2. In such examples, multiple levels of bias current can be provided to the differential transconductor 12. For example, where m=2 there can be four different levels of bias current and where m=8 there can be 256 different levels of bias current. In other example embodiments, digital output 40 is replaced by analog output 40' such that the bias current control signal is analog in nature.

It also should be noted that the relationship between the input and output of the bias current controller 18 can be linear or non-linear. Furthermore, the logic of the bias current controller 18 can take many forms including discrete logic, state machines, microprocessors, etc. Also, in certain alternate embodiments, the number of words being examined by the bias current controller can be more than 1. For example, bias current controller 18 can look for patterns of data in several words indicating the imminent arrival of a peak. As noted above, the output 40 of the bias current controller 18 can be a digital signal having a width w of at least one bit (e.g. the output signal can be one or more bits) and/or the output 40' of the bias current controller can be an analog signal, by way of non-limiting examples.

In this example embodiment, the pair of outputs 26 of the differential amplifier 12 is coupled to a primary coil 42 of transformer 20. In this embodiment, a center tap 44 of the primary coil 42 is coupled to a power supply source $V_S$. A secondary coil 46 can be coupled, for example, to the center conductor 48 and coaxial braid 50 of coaxial cable 22.

Figure 2:
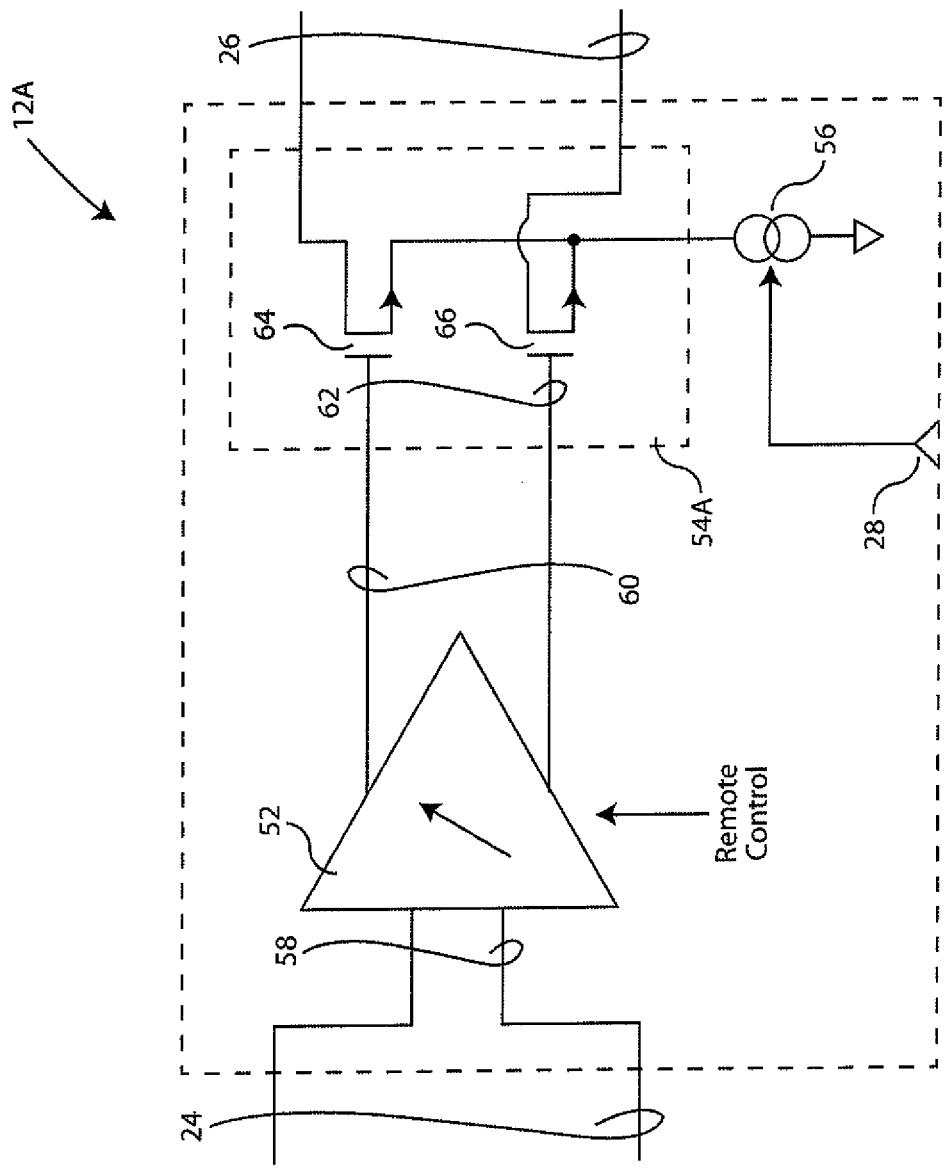
FIG. 2 is a block diagram of a first example differential amplifier 12A of FIG. 1.

FIG. 2 is a block diagram, set forth by way of example and not limitation, of a first differential amplifier 12A suitable for use in the apparatus of FIG. 1. In this non-limiting example, differential amplifier 12A includes a first amplifier 52, a second amplifier 54A, and a digitally controlled variable current source 56. Differential inputs 58 of first amplifier 52 are coupled to the pair of differential inputs 24 of the differential amplifier 12A and differential outputs 60 of the first amplifier 52 are coupled to differential inputs 62 of second amplifier 54A.

In this non-limiting example, second amplifier 54A includes a first Metal Oxide Field Effect Transistor (MOSFET) 64 and a second MOSFET 66. The sources of MOSFET 64 and MOSFET 66 are coupled to digitally controlled, variable current source 56, the gates of MOSFET 64 and MOSFET 66 are coupled to differential inputs 62, and the drains of MOSFET 64 and MOSFET 66 comprise the pair of outputs 26 of differential amplifier 12A. A digital signal applied to bias current control input 28 determines the current developed by current source 56 which biases the MOSFETs 64 and 66 to set an amplification level.

In this non-limiting example, first amplifier 52 may be a variable amplifier. For example, if the differential amplifier 12A is being uses as a DOCSIS upstream amplifier, the cable company's central office may send signals over the cable 22 to change the amplification level of the first amplifier 52. That is, if the signal from the upstream amplifier is detected that it is too weak at the central office, the amplification can be increased, and if it is detected that the signal is stronger than necessary, the amplification can be reduced.

Figure 3:
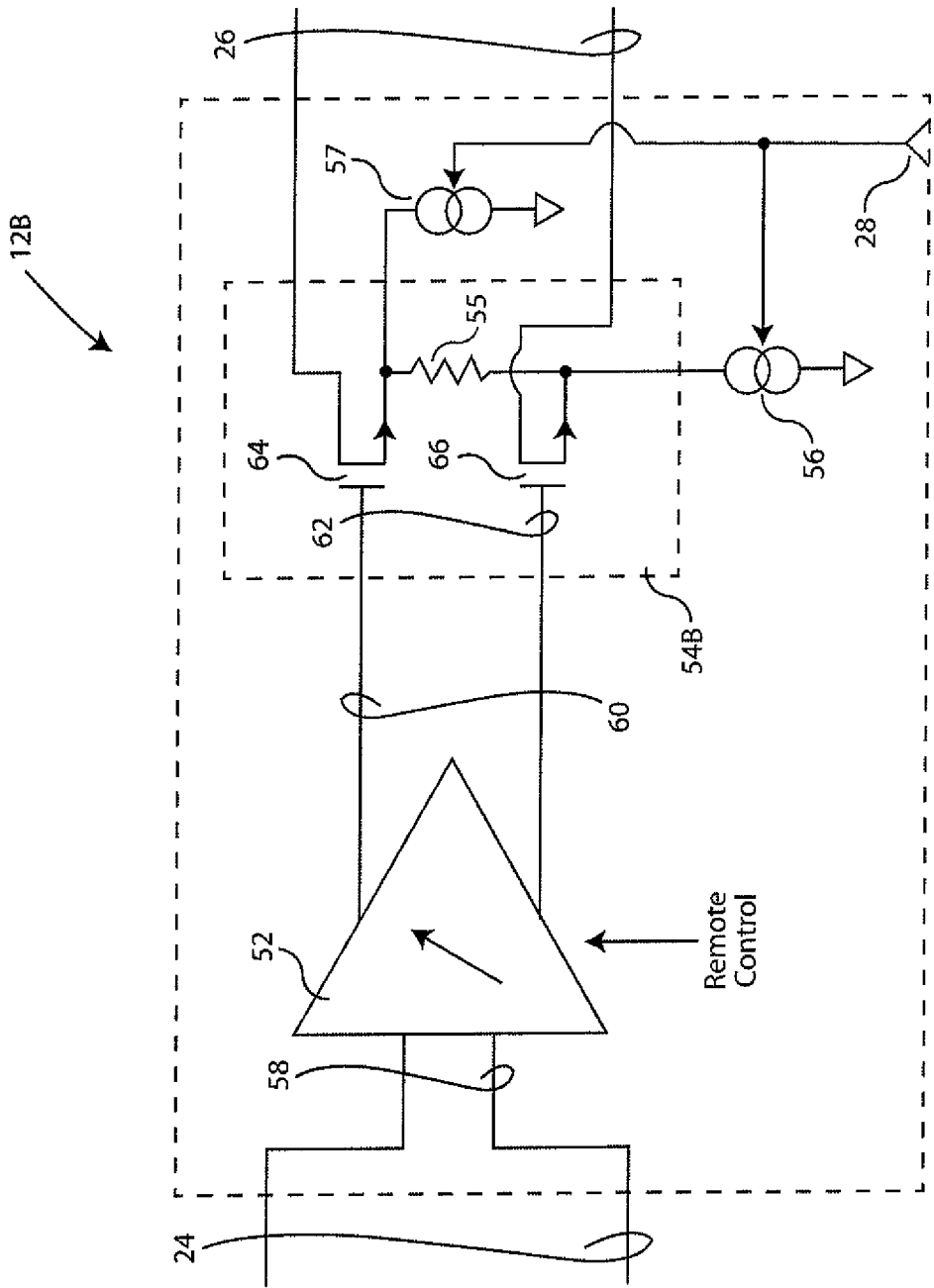
FIG. 3 is a block diagram of a second example differential amplifier 12B of FIG. 1.

FIG. 3 is a block diagram, set forth by way of example and not limitation, of a second differential amplifier 12B suitable for use in the apparatus of FIG. 1. In this second example, like reference numerals of FIG. 3 correspond to like elements of the other figures. An example alternative second amplifier 54B includes a degeneration resistor 55 coupling the sources of MOSFET 64 and MOSFET 66 together. The second differential amplifier 12B also includes a second variable current source 57 that is coupled between the source of MOSFET 64 and ground. The second variable current source 57 is, in this non-limiting example, coupled to the same bias current control input 28 as the first variable current source 56.

Figure 4:
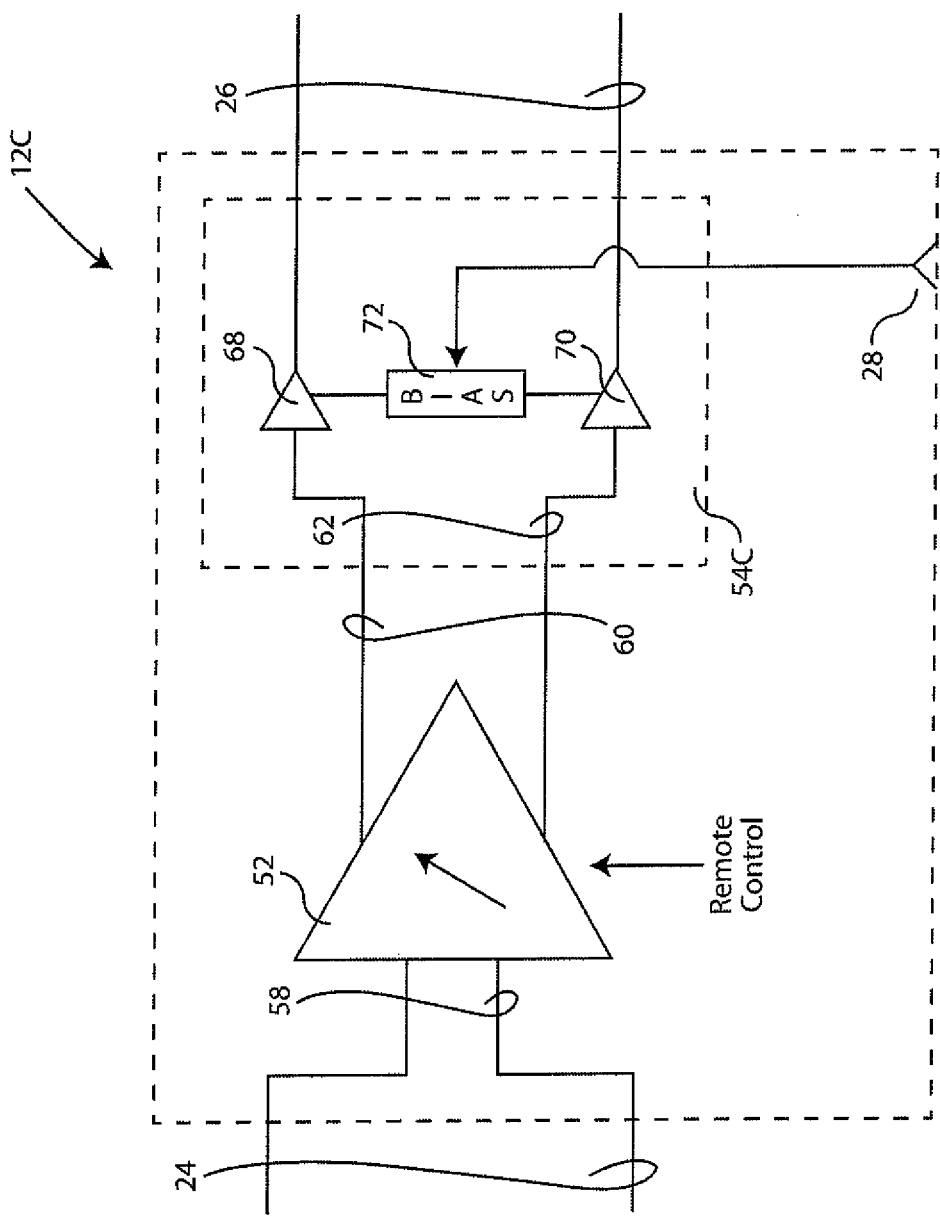
FIG. 4 is a block diagram of a third example differential amplifier 12C of FIG. 1.

FIG. 4 is a block diagram, set forth by way of example and not limitation, of a third differential amplifier 12C suitable for use in the apparatus of FIG. 1. In this third example, like reference numerals of FIG. 4 correspond to like elements of the other figures. An example alternative second amplifier 54C includes a first amplifier 68, a second amplifier 70, and a bias generator 72 which is controlled by a signal on bias control input 28 and which is coupled to each of amplifiers 68 and 70. The inputs of amplifiers 68 and 70 are coupled to the differential inputs 62 of the second amplifier 54C and the outputs of amplifiers 68 and 70 are coupled to the outputs 26 of the third example differential amplifier 12C.

It will be appreciated that the differential amplifier 12 can take many forms. In certain embodiments, a single amplifier is used. In other embodiments, multiple amplifiers are used. In some embodiments, the multiple amplifiers are connected in stages (e.g. in series), such as in the example of differential amplifier 12A of FIG. 2. In other embodiments, a separate amplifier is used for each line of the differential input pair. Furthermore, should amplification control be desired, it can be accomplished with fixed amplifiers coupled to variable attenuators.

It will further be appreciated that the energy efficient, low distortion amplifiers for analog signals as described with respect to example embodiments, above, have a wide variety of useful applications. A particular application, that of DOCSIS upstream amplifiers, will now be described by way of further non-limiting examples.

DOCSIS upstream amplifiers typically amplify multiple digitally modulated channels simultaneously while keeping spurious distortion products very low, typically more than 50 dB below the carrier level. To achieve the low distortion levels, Class A amplification is generally used. However, combining multiple digitally modulated carriers creates a signal with a very high peak-to-average ratio. Because the peaks must be faithfully reproduced to minimize bit error rate ("BER"), the amplifier must be biased to accommodate the peaks. In example embodiments as set forth herein, the input data is sampled to detect large peaks and the upstream amplifier (e.g. differential amplifier 12) is increased to handle the peak signal swing.

In certain example embodiments, the upstream amplifier 12 is a balanced transconductor. The balanced open drain (or open collector) outputs are coupled to the load (e.g. cable 22) using a center tapped transformer 20. The balanced amplifier voltage supply $V_S$ is provided through the center tap of the transformer. Because the common mode inductance through the center tap is very low, typically a few nano-Henry's (nH), the supply current of the amplifier can be changed rapidly without disturbing the DC operating point. For example, if the common mode inductance is 10 nH, changing the supply current by 100 mA in a time of 100 nsec will result in a change in the common mode output voltage of 10 mV.

In certain example embodiments, a FIFO buffer 14 is added at the input 34 of the DAC 16 which drives the upstream amplifier 12. An additional circuit, e.g. bias current controller 18, is added which monitors the input 30 to the FIFO buffer 14 and controls the supply current to the balanced transconductor. When the amplitude of the digital signal in the buffer exceeds a threshold level, the circuit ramps-up the supply current to the transconductor. Because the common mode response of the amplifier is very rapid, the amplifier supply current can be made to track the peaks in the input signal, reducing the power dissipated in the amplifier.

In certain example embodiments, FIFO buffer 14, DAC 16, bias current controller 18, and differential amplifier 12 are implemented on the same integrated circuit (IC). In other embodiments, these devices can be made from discrete components or distributed among different ICs with appropriate interface signals.

The upstream amplifier 12 of this non-limiting example uses a balanced configuration including a center tapped transformer to convert the balanced signal to single ended, and to bias the output stage. Among its other advantages, the low common mode impedance of the CT transformer allows the bias in the output stage to change rapidly. For example, the common mode inductance of the CT primary is typically less than 5 nH. When parasitic inductance of the package leads and PCB traces is included, the total inductance is ~10 nH. This means that changing the bias current by 100 mA in 100 ns results in a ~10 mV transient on the supply. This allows the possibility of rapidly varying the supply current to accommodate peaks in the signal swing.

In example embodiments, input data from, for example, a cable box modulator is passed through a FIFO buffer before it goes to the DAC to provide a delay. The bias current controller 18 (a/k/a "digital power detector") measures the instantaneous amplitude of the digital signal, which is proportional to the analog signal level that the upstream amplifier must amplify. The detector then adjusts the supply current of the output stage to accommodate the signal swing in certain non-limiting examples. The delay provided by the FIFO buffer 14 allows the bias current controller 18 to "look ahead", anticipating the finite time required to ramp the supply current. This allows the differential amplifier 12 to operate at high power dissipation only when it is required for signal peaks, lowering the average power dissipation of the apparatus.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. An energy efficient, low distortion amplification apparatus comprising:
   a differential amplifier having a pair of differential inputs, a pair of outputs, and a bias current control input;
   a digital delay having an n-bit word input and an m-bit word output;
   a digital-to-analog converter (DAC) having an input coupled to the output of the digital delay and a pair of differential outputs coupled to the pair of differential inputs of the differential amplifier; and
   a bias current controller having an input coupled to the digital delay and having an output coupled to the bias current control input of the differential amplifier;
   wherein the digital delay includes a First-In-First-Out (FIFO) buffer;
   wherein the input of the bias current controller is coupled to the n-bit word input of the digital delay; and
   wherein the output of the bias current controller is a digital signal having a width w of at least one bit.

2. An energy efficient, low distortion amplification apparatus as recited in claim 1 wherein the output of the bias current controller is related to the input of the bias current controller.

3. An energy efficient, low distortion amplification apparatus as recited in claim 1 wherein the output of the bias current controller is an analog signal.

4. An energy efficient, low distortion amplification apparatus comprising:
- a differential amplifier having a pair of differential inputs, a pair of outputs, and a bias current control input;
- a digital delay having an n-bit word input and an m-bit word output;
- a digital-to-analog converter (DAC) having an input coupled to the output of the digital delay and a pair of differential outputs coupled to the pair of differential inputs of the differential amplifier; and
- a bias current controller having an input coupled to the digital delay and having an output coupled to the bias current control input of the differential amplifier;
- wherein the differential amplifier includes a variable current source coupled to the bias current control input.

5. An energy efficient, low distortion amplification apparatus as recited in claim 4 wherein the differential amplifier includes multiple amplifiers.

6. An energy efficient, low distortion amplification apparatus as recited in claim 5 wherein the multiple amplifiers are configured in sequential stages.

7. An energy efficient, low distortion amplification apparatus as recited in claim 5 wherein at least one of the multiple amplifiers is a variable amplifier.

8. An energy efficient, low distortion amplification apparatus as recited in claim 5 wherein at least one of the multiple amplifiers is biased by the variable current source.

\* \* \* \* \*